United States Patent
Wen

[11] Patent Number: 5,786,618
[45] Date of Patent: Jul. 28, 1998

[54] ROM MEMORY CELL WITH NON-UNIFORM THRESHOLD VOLTAGE

[75] Inventor: Jemmy Wen, Hsinchu, Taiwan

[73] Assignee: United Microelectronics, Corp., Hsinchu, Taiwan

[21] Appl. No.: 620,016

[22] Filed: Mar. 21, 1996

[51] Int. Cl.⁶ .................. H01L 27/112; H01L 29/78
[52] U.S. Cl. .................. 257/391; 257/404; 365/104
[58] Field of Search .................. 257/390, 391, 257/404; 365/104

[56] References Cited

U.S. PATENT DOCUMENTS 4,395,725 7/1983 Parekh .................. 257/404
4,549,336 10/1985 Sheppard .................. 257/404

*Primary Examiner*—Gene M. Munson
*Attorney, Agent, or Firm*—Fish & Richardson P.C.

[57] ABSTRACT

The present invention features a ROM memory cell with a non-uniform threshold voltage. The ROM memory cell includes a channel region divided into several channels deposed in parallel along the axial direction of carrier transport. Afterwards, one code-implant procedure is performed to program the memory cell to store one of multiple states, thereby constituting a multiple-state ROM, the fabrication of which does not require multiple photolithography as well as multiple implantation processes.

6 Claims, 3 Drawing Sheets

ROM MEMORY CELL WITH NON-UNIFORM THRESHOLD VOLTAGE

BACKGROUND OF THE INVENTION

1. Field of the Invention

The present invention generally relates to semiconductor devices. More particularly, the present invention relates to a ROM memory cell with a non-uniform threshold voltage.

2. Description of the Related Art

ROMs (read only memories) are widely used semiconductor integrated circuits (IC) memory storage devices for digital electronic equipment, in particular, microprocessor-based computer systems, to store predetermined programs. In a conventional semiconductor ROM device, the channel region of a memory cell is selectively implanted with ions to adjust the threshold voltage thereof depending on whether the programmed memory cell is turned on or turned off, to represent a logic "1" or a logic "0" in binary code, respectively. Conventional ROM IC devices, therefore, store a single binary bit in each of their memory cells. Then, conventional digital electronic circuitry in the ROM employs sense amplifiers to sense the content of an addressed memory cell for "reading." The sensed result with respect to each memory cell within the ROM is identified as one of two possible electrical potential states. In other words, the memory content of a ROM memory cell, as read, is either a logic "1" or a logic "0."

Referring to FIG. 1, a conventional ROM memory cell is shown in two cross-sectional views. The cross-sectional view in the left-hand side is cut along the direction in which carriers transport, and the cross-sectional view in the right-hand side is cut along a direction perpendicular to that of the carrier transport. In general, the memory cell is a metal-oxide-semiconductor (MOS) field-effect transistor formed in a semiconductor substrate 1, such as a P-type or N-type silicon substrate. Field oxides are formed by the local oxidation of silicon (LOCOS) method on the semiconductor substrate 1 as isolation structures 100 to define an active region 110 therebetween. A gate stack 13, having a gate dielectric layer 10 and a gate electrode 12, is formed on the semiconductor substrate 1 within the active region 110. A pair of source/drain regions 16 are deposed in the substrate 1 and separated on opposite sides of the gate stack 13. The source/drain regions 16 are formed by implanting either N-type impurities if the substrate 1 is of P-type conductivity, or P-type impurities if the substrate 1 is of N-type conductivity. Accordingly, a channel region 14 is formed in the substrate 1 just below the gate stack 13 and between the source/drain regions 16. The threshold voltage of the channel region may be adjusted to a predetermined value through a threshold adjustment implantation prior to the formation of the gate dielectric layer 10.

After the memory cell is fabricated with the structure depicted in FIG. 1, the channel region 14 is subjected to a code-implant procedure. That is, the channel region 14 is selectively implanted with ions to adjust the threshold voltage depending on whether the programmed memory cell, which is to be turned on or turned off, represents a binary logic "1" or a logic "0", respectively, based on the customer's specification.

However, the trend in the semiconductor industry has been to increase the number of memory cells so as to increase the storage capacity of a semiconductor integrated circuit chip, while reducing the size of the semiconductor device itself. Enlarged memory capacity and reduced memory semiconductor die size represent increased functionality and reduced cost, both of which are desirable qualities from a merchandising point of view. Great effort has been expended in the art of semiconductor chip manufacture to reduce the dimensions of semiconductor devices in order to squeeze more memory cells into the same semiconductor die area. This approach, however, is limited by the resolution available according to the current state of fabrication techniques.

Increasing the number of states to which a memory cell can correspond is a practicable means for overcoming present limitations. Consequently, a tri-state read-only memory has been disclosed, the threshold voltage of which is adjusted through multiple code-implant procedures with different dosages to be, for example, 5V, 2.5V, or 0.8V, respectively. In such a way, the number of states which a memory cell can store is increased. Nevertheless, multiple code-implant procedures imply, that multiple photolithography procedures with the same times are required. Accordingly, the period for delivery is prolonged and commercial competitiveness is reduced.

For the forgoing reasons, there is a need for a ROM memory cell which can be programmed into one of multiple states merely through a single code-implant procedure.

SUMMARY OF THE INVENTION

Therefore, the present invention concerns a ROM memory cell with non-uniform threshold voltage which can be programmed into one of multiple states by one code-implant procedure.

Accordingly, the present invention achieves the above-identified object by providing a memory cell, comprising: a semiconductor substrate having isolation structures formed thereon to define an active region therebetween; a gate stack formed on the substrate within the active region; source/drain regions formed in the substrate and separated on opposite sides of the gate stack; and a channel region, formed in the substrate below the gate stack and between the source/drain regions, and divided into several channels deposed in parallel and provided with different threshold voltages.

DETAILED DESCRIPTION OF THE PREFERRED EMBODIMENT

Figure 1:
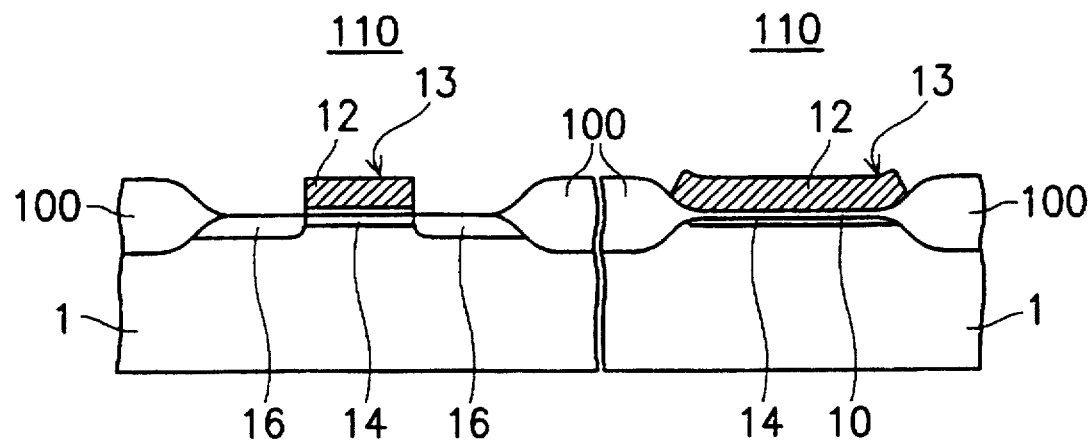
FIG. 1 depicts a conventional ROM memory cell in cross section.
Figure 2:
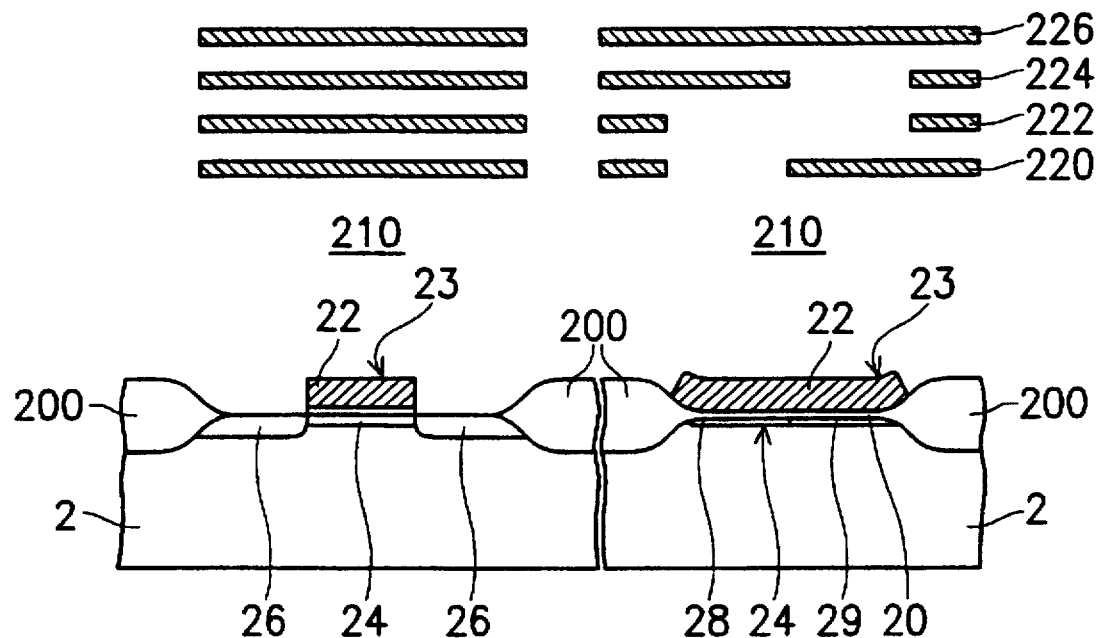
FIG. 2 depicts the cross-sectional view of one embodiment in accordance with the present invention.
Figure 3:
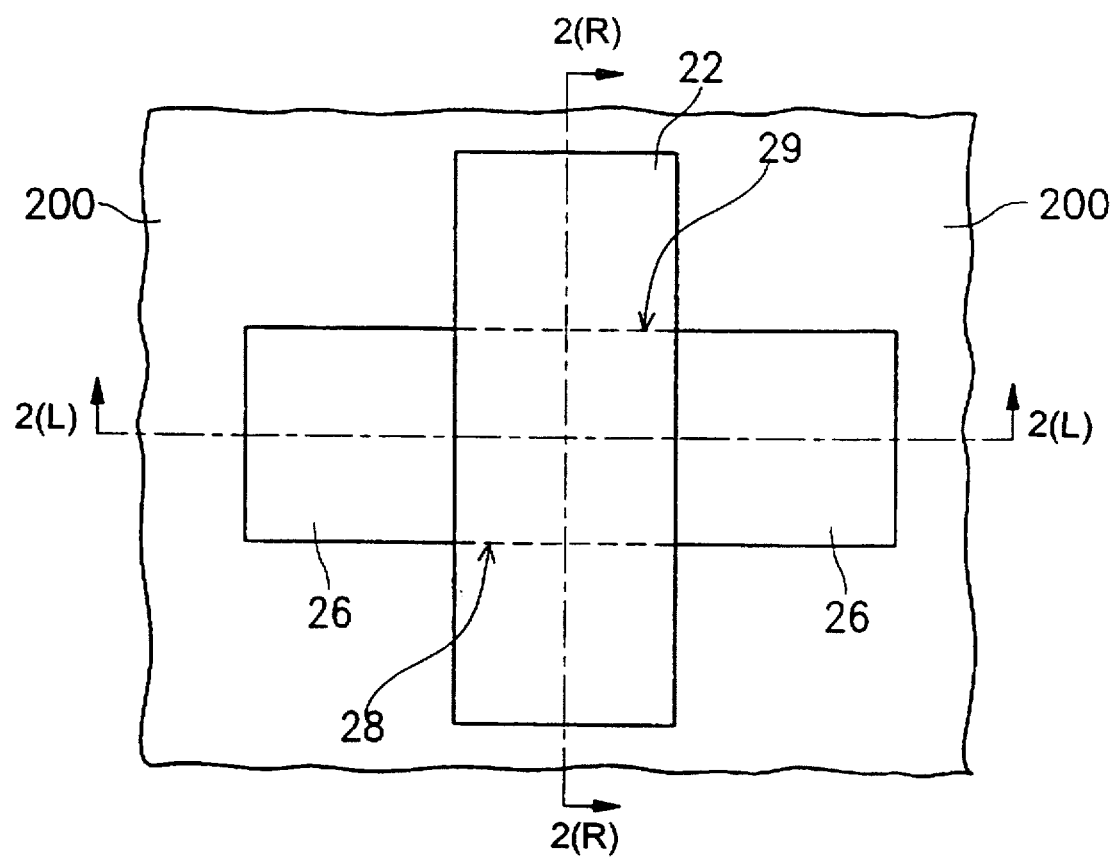
FIG. 3 depicts the top view of the embodiment shown in FIG. 2.

Referring to FIGS. 2 and 3, the cross-sectional view and top view of one preferred embodiment are schematically shown, respectively. In FIG. 2, the cross-sectional view on the left-hand side is cut along a line A—A of FIG. 3, that is along the direction in which carriers transport. The cross-sectional view in the right-hand side is cut along a line B—B shown in FIG. 3, that is in the direction perpendicular to that of carrier transport.

As depicted in the drawings, according to the present invention, a memory cell is formed in a semiconductor substrate 2, for instance, a P-type or N-type silicon substrate. Field oxides are formed by the local oxidation of silicon (LOCOS) method and formed on the semiconductor substrate 2 as isolation structures 200 to define an active region 210 therebetween. A gate stack 23 consisting of a gate dielectric layer 20 and a gate electrode 22 covering the gate dielectric layer is formed on the substrate 2 within the active region 210. A pair of source/drain regions 26 are formed in the semiconductor 2 separated at opposite sides of the gate stack 23. The source/drain regions 26 are preferably formed by either implanting N-type impurities if the substrate 2 is of P-type conductivity, or P-type impurities if the substrate 2 is of N-type conductivity using the gate stack 23 as a self-aligned mask. A channel region 24 is formed in the semiconductor substrate 2 just below the gate stack 23 and between the source/drain regions 26. When a gate voltage exceeding the threshold voltage is applied to the gate electrode 22, the induced carriers constituting the channel region 24 are transported from one source/drain region to another.

In accordance with the present invention, the channel region 24 is divided into several channels, for example, a first channel 28 and a second channel 29 along the axial direction of carrier transport. Note that the first channel 28 and the second channel 29 correspond to different threshold voltages, designated as $V_{T1}$ and $V_{T2}$, respectively, which may be made by threshold adjustment implantation prior to the formation of the gate dielectric layer 20.

When programming the memory cell depicted in FIG. 2 into one of multiple states, one of four code masks 220, 222, 224, 226 may be chosen to serve as masking while a code-implant procedure is performed. As depicted in the drawing, the code mask 220 exposes the first channel 28 but covers the second channel 29. The code mask 222 exposes both of the first and second channels 28 and 29. The code mask 224 covers the first channel 29 but exposes the second channel 29. Moreover, the code mask 226 covers the first and second channel regions 28 and 29 at the same time.

Since one code-implant procedure is subsequently utilized to implant impurities into the portions of the channel region 24 not covered by code masks 220, 222, 224, 226, the threshold voltages of the implanted first and second channels 28 and 29 are changed to, for example, those designated as $V_{T1}'$ and $V_{T2}'$, respectively. If the memory cell is an NMOS device and the implanted impurities used in the code-implant are P-type ions, typically $B^+$ or $BF_2^+$, the implanted threshold voltages, $V_{T1}'$ and $V_{T2}'$, will be increased, and the corresponding ON-currents will be decreased for the same gate voltage. Conversely, if the implanted impurities are N-type ions, such as phosphorus or arsenic, the implanted threshold voltages $V_{T1}'$ and $V_{T2}'$ will be decreased and the corresponding ON-currents will be increased for the same gate voltage. For the same reasons, when the memory cell is a PMOS device, the implanted impurities might be either N-type or P-type, respectively, to achieve the respective increase or decrease in ON-currents for the same gate voltage.

Figure 4:
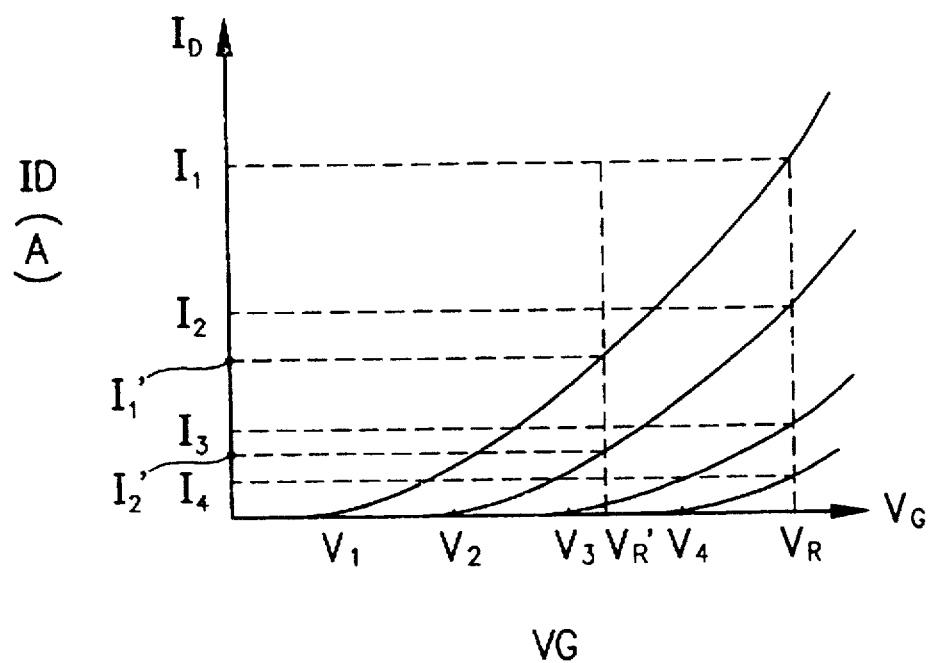
FIG. 4 depicts the transfer characteristic curve of drain current (ID) versus gate voltage (VG) of memory cells with different threshold voltages.

Referring next to FIG. 4, the transfer characteristic curve of drain current (ID) versus gate voltage (VG) is shown. As $V_R$ is a reading voltage applied at the gate electrodes, $V_{T1}=V_1$, $V_{T2}=V_2$, $V_{T1}'=V_3$ and $V_{T2}'=V_4$. The corresponding ON-currents $I_1, I_2, I_3, I_4$ have the relationship of $I_1>I_2>I_3>I_4$. Accordingly, the memory cell shielded by the code mask 220 produces an ON-current of "$I_3+I_2$," the memory cell shielded by the code mask 222 produces an ON-current of "$I_3+I_4$," the memory cell shielded by the code mask 224 produces an ON-current of "$I_1+I_4$," and the memory cell shielded by the code mask 226 produces an ON-current of "$I_1+I_2$." Therefore, those memory cells constitute a read-only memory with four states. In the same manner, if $V_{T1}=V_1$, $V_{T2}=V_3$, $V_{T1}'=V_2$, and $V_{T2}'=V_4$, the memory cell also can be programmed to one of multiple states.

In addition, if the reading voltage is changed to $V_R'$ resulting in $I_3'=I_4'\cong 0$ and $I_1'>I_2'$, the memory cell may be programmed to one of multiple states. Consequently, the magnitudes of $V_{T1}$, $V_{T2}$, $V_{T1}'$, and $V_{T2}'$ are mutually operated in coordination, the adjustment of which is performed by ion implantation. Also, the reading voltage $V_R$ is adjustable depending on how many states are required.

In conclusion, the present invention, a ROM's memory cell with non-uniform threshold voltage, divides the channel region into several channels arranged in parallel along the axial direction of carrier transport. After that, one code-implant procedure is performed to program the memory cell into one of multiple states to constitute a multiple-state ROM without multiple photolithography and multiple implantation processes.

What is claimed is:

1. A memory comprising:

a semiconductor substrate having isolation structures formed thereon to define a plurality of active regions, wherein the plurality of active regions are divided into subsets, there being a first subset, a second subset, a third subset, and a fourth subset;

above each of said active regions, a gate stack on said substrate within that active region;

in each of said active regions, source and drain regions in said substrate separated on opposite sides of said gate stack;

in each of said active regions, a channel region in said substrate below said gate stack and between said source and drain regions, said channel region comprising a first channel and a second channel deposed in parallel with each other and provided with different threshold voltages;

in each of said active regions of the first subset, impurities implanted in both the first and second channels to produce a first programmed state;

in each of said active regions of the second subset, impurities implanted in the first channel but not the second channel to produce a second programmed state;

in each of said active regions of the third subset, impurities implanted in the second channel but not the first channel to produce a third programmed state;

in each of said active regions of the fourth subset, impurities implanted in neither the first channel nor the second channel to produce a fourth programmed state.

2. The memory of claim 1, wherein said semiconductor substrate and said impurities in the channel regions of said plurality of active regions are P-type.

3. The memory of claim 1, wherein said semiconductor substrate and said impurities in the channel regions of said plurality of active regions are N-type.

4. The memory of claim 1, wherein said semiconductor substrate is P-type and said impurities in the channel regions of said plurality of active regions are N-type.

5. The memory of claim 1, wherein said semiconductor substrate is N-type and said impurities in the channel regions of said plurality of active regions are P-type.

6. The memory of claim 1, wherein the gate stack over each of said active regions comprises a gate dielectric layer and a gate electrode formed over said gate dielectric layer.

* * * * *